United States Patent [19]

Drouot

[11] Patent Number: 5,708,420
[45] Date of Patent: Jan. 13, 1998

[54] VOLTAGE DETECTION CIRCUIT COMPENSATED IN TECHNOLOGY AND TEMPERATURE

[75] Inventor: Sylvie Drouot, Luynes, France

[73] Assignee: SGS-Thomson Microelectronics S.A., Saint Genis, France

[21] Appl. No.: 589,220

[22] Filed: Jan. 22, 1996

[30] Foreign Application Priority Data

Jan. 23, 1995 [FR] France ................................. 95 00862

[51] Int. Cl.$^6$ ................................................ G08B 21/00
[52] U.S. Cl. .................... 340/660; 340/661; 340/635; 340/657; 340/664; 327/535
[58] Field of Search ................................. 340/660, 661, 340/663, 635, 657, 664; 327/534, 535

[56] References Cited

U.S. PATENT DOCUMENTS

| | | | |
|---|---|---|---|
| 3,628,070 | 12/1971 | Heuner et al. | 307/304 |
| 4,140,930 | 2/1979 | Tanaka | 307/362 |
| 4,160,176 | 7/1979 | Takahashi | 340/663 |
| 4,309,627 | 1/1982 | Tabata | 307/362 |
| 4,617,473 | 10/1986 | Bingham | 307/66 |
| 4,716,323 | 12/1987 | Wada et al. | 307/594 |
| 4,980,792 | 12/1990 | Kertis et al. | 361/111 |
| 5,043,652 | 8/1991 | Rybicki et al. | 37/535 |
| 5,115,187 | 5/1992 | Hayashi | 327/535 |
| 5,155,429 | 10/1992 | Nakao et al. | 327/535 |
| 5,196,833 | 3/1993 | Kemp | 340/663 |

FOREIGN PATENT DOCUMENTS

A-0 093 606  11/1983  Japan ................. G01B 19/16

OTHER PUBLICATIONS

French Search Report from French Patent Application 95 00862, filed Jan. 23, 1995.

Primary Examiner—Thomas Mullen
Assistant Examiner—Timothy Edwards, Jr.
Attorney, Agent, or Firm—Wolf, Greenfield & Sacks, P.C.; James H. Morris

[57] ABSTRACT

A voltage detection circuit includes a first resistive arm receiving an internal voltage to produce a basic current, current amplification circuitry to produce a reference current proportional to the basic current, a second resistive arm to produce a reference voltage representing the reference current, a voltage source to produce a control voltage from the reference voltage and a logic circuit to produce a binary signal from the control voltage, the state of the binary signal representing the value of the internal voltage.

20 Claims, 2 Drawing Sheets

VOLTAGE DETECTION CIRCUIT COMPENSATED IN TECHNOLOGY AND TEMPERATURE

BACKGROUND OF THE INVENTION

1. Field of the Invention

The invention relates to a voltage detection circuit compensated in technology and temperature. Typically, the aim of a voltage detection circuit is to provide a piece of information on the value of a given variable voltage. The invention can be applied, for example, in any semiconductor integrated circuit such as an electrically programmable memory comprising a voltage generator circuit producing a voltage to be regulated.

2. Discussion of the Related Art

In order to program electrically programmable memories in integrated circuit form, it is generally necessary to have a voltage called a programming voltage VB in the integrated circuit that is higher than the normal supply voltage VCC of the circuit. For example, VCC would be equal to 5 volts and VB equal to 7 volts or more.

In certain memories, the programming voltage VB is produced within the integrated circuit, from the normal supply voltage VCC. For this purpose, a switched capacitance voltage multiplier circuit, also commonly called a charge pump, is used. This circuit receives VCC and produces the voltage VB. The voltage multiplier circuits typically use diodes, capacitors and a clock signal. For example, in a first stage, a first capacitor is charged to VCC and then discharged in a second capacitor. Then the same operation is started again and the voltage at the terminals of the second capacitor increases gradually. The programming voltage VB will tend asymptotically towards a boundary value, this boundary value being equal to a multiple of the supply voltage VCC (twice VCC in the example described here above which corresponds to a circuit known as a Schenkel doubling circuit).

This type of assembly raises a problem if the value of the programming voltage to be attained is equal to the boundary value. Indeed, the voltage produced increases at an ever lower speed as and when the second capacitor gets charged. To limit the time taken by the voltage to build up to the desired value, it therefore becomes necessary to oversize the charge pump, namely to fix a boundary value greater than the desired value of voltage produced. It is then necessary to place a voltage regulator at the output of the pump. This voltage regulator limits the voltage produced to the desired value. Furthermore, if the desired value is not a multiple of the value of the supply voltage, the presence of such a regulator circuit becomes necessary.

There are two ways of regulating the voltage produced:

without stopping the pump, in consuming the excess charge produced by the pump, once the desired value has been reached, by connecting the output of the pump to a ground by means of, for example, one or more diodes, by stopping the pump when the desired value is reached and by starting it again when the voltage at the terminals of the second capacitor becomes excessively low.

The second approach has the advantage of consuming less power. Since the present trend is precisely towards reducing the values of supply voltage and current consumed in electronic circuits, it is particularly valuable.

To stop a charge pump, it is possible to use a detection circuit as illustrated in FIG. 1.

This detection circuit includes:

a first resistive arm including a resistor R0, this arm receiving the voltage produced VB to produce a current I0, a current mirror M connected to the first resistive arm to produce a reference current I1=k * I0, proportional to the current I0, a second resistive arm, connected to the current mirror and including a resistor R1, to produce a reference voltage V1=VCC–R1 * I1, and a logic circuit (in practice an inverter) receiving the voltage V1 and producing a binary signal ON to stop the charge pump or turn it on.

The ON signal will change the logic state for a voltage value produced VBM such that V1=VCC/2.

We have VBM=(R0 * VCC)/(2 * k * R1)+x * $V_{tn}$, with x as an integer greater than or equal to 1, and $V_{tn}$ as the threshold voltage of an N type MOS transistor (assuming that the current mirror is formed by means of an N type MOS transistor and that the value of the switch-over voltage VBM is shifted by means of N type diodes to reduce the consumption in the first resistive arm to a minimum).

This type of circuit experiences a problem due to variations or drifts in the electronic characteristics of the components.

Integrated circuits are liable to undergo three types of variation:

variations in supply voltage (which are in principle independent of the circuits supplied and shall therefore not be dealt with here), variations pertaining to methods for the manufacture of the circuits, called variations in technology, and variations pertaining to the temperature to which the circuits are subjected in operation, known as variations in temperature.

The variations in technology depend chiefly on the lithographic tolerances of manufacture. They are all the more sensitive for a component as its dimensions decrease in size. Thus, in MOS (metal-oxide-semiconductor) technology, the variations relate more particularly to the transistors whose oxide layer dimensions (thickness, lengths and effective widths) are small.

The temperature variations are related chiefly to the characteristics of implantation (type of implantation, rate of implantation, etc.). They are applicable to passive components (resistors) as well as to active components.

It is generally very important, for a given circuit, to foresee the margins of the variations that may affect this circuit so as to ascertain that there is no risk that the variations might adversely modify their operation. To do this, the general procedure is to set up models of the circuits as a function of the variations that may affect them, the models being set up through computation and/or the experience of the designer. This model-making procedure is most often represented in graphic form by Gaussian curves characterized by a typical value (this is the most probable value on which the Gaussian curve is centered) and a mean standard deviation. On the basis of this model-making operation, it is possible to foresee the variations of operating characteristics of the circuit such as consumption, response time, etc.

In a circuit such as the one shown in FIG. 1, it is possible, if necessary, to envisage providing compensation for temperature variations in order to obtain a switch-over voltage value VBM that is relatively stable over the range of use guaranteed by the manufacturer (generally in the range of −45° to +125° C.). It is then enough to choose resistors R0 and R1 having adequate temperature coefficients to compensate for the variations of the values of R0, R1 and $V_m$.

The choice of the resistors (type of technology and value in ohms) will be related to the knowledge of values of statistical variance. Typically, if the temperature increases, the real values of resistance in the diffused and pinch-off regions tend to increase while the threshold voltages of the transistors tend to decrease. If the temperature coefficient of R0 is more positive than that of R1, the ratio R0/R1 will tend to increase with the temperature, and thus compensate for the reduction of $V_m$. On the whole, it is possible to attenuate the variation in temperature of the value of VBM.

By contrast, it is not possible to compensate for the variations in technology of the threshold voltage $V_m$. As compared with its typical value, $V_m$ will therefore be affected by a constant error which will be carried over to its temperature variation.

We will have:

$$VBM = (R0(T) * VCC)/(2 * k * R1(T)) + x * V_m(T,P)$$

with $R0(T) = R0(T_{ref}) * (1 + k0 * (T - T_{ref}))$, $R1(T) = R1(T_{ref}) * (1 + k1 * (T - R_{ref}))$, $V_m(T, P) = (V_m(P_{ref}, L_{ref}) + \delta V_m(P, T_{ref})) + \delta V_m(P, T)$, with $T_{ref}$ as a reference temperature (generally 25° C.), k0 and k1 the coefficients of temperature of the resistors R0 and R1, $V_m(P_{ref}, T_{ref})$ the threshold voltage corresponding to the reference temperature and to the typical value in manufacture, $\delta V_m(P, T_{ref})$ the error induced by manufacture (constant error at given temperature) and $\delta V_m(P, T)$ the error in temperature associated with the real value of $V_m$ (typical $V_m$ + manufacturing error).

One aim of the invention is to provide a detection circuit working similarly to the circuit of FIG. 1, that also enables compensation for the variations in technology of the threshold voltage.

SUMMARY OF THE INVENTION

The invention provides a voltage detection circuit to provide a binary signal whose state represents the value of an internal voltage, comprising a first resistive arm receiving the internal voltage to produce a basic current, current amplification means to produce a reference current proportional to the basic current, a second resistive arm to produce a reference voltage representing the reference current, a voltage source to produce a control voltage from the reference voltage and a logic circuit to produce the binary signal from the control voltage.

The invention therefore provides the addition of a supplementary stage to the detection circuit that will enable compensation for the technological variations of the circuit of FIG. 1.

BRIEF DESCRIPTION OF THE DRAWINGS

Other advantages and special features shall appear from the following detailed description of an exemplary embodiment of the invention, given by way of an indication that in no way restricts the scope of the invention, and made with reference to the appended drawings, of which.

DETAILED DESCRIPTION

It shall be assumed that the circuits illustrated are made with MOS technology.

Figure 2:
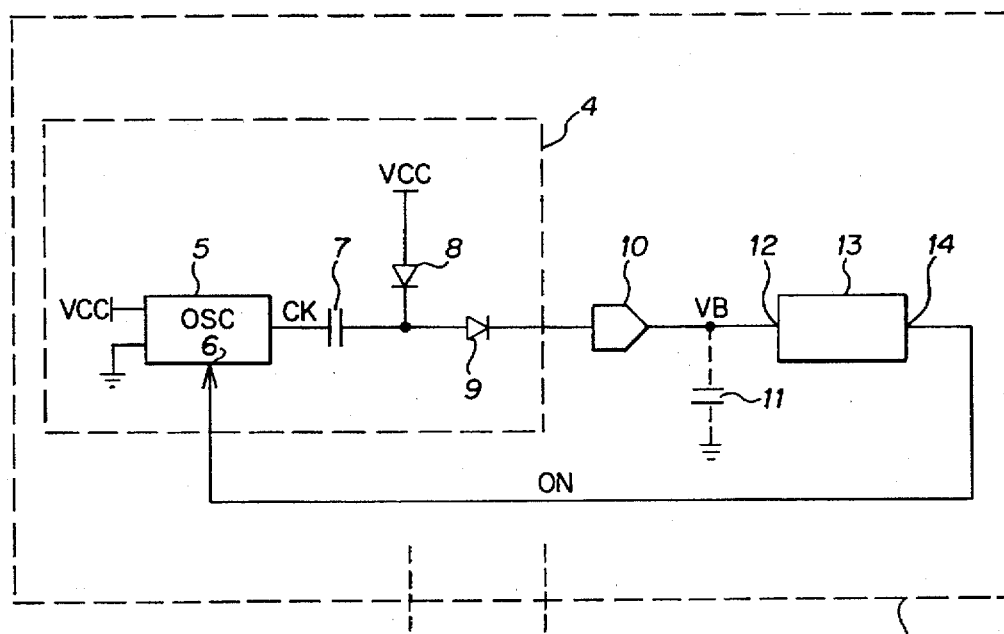
FIG. 2 shows a circuit comprising a detection circuit according to the invention.

FIG. 2 shows an integrated circuit 1 comprising:

a supply terminal 2 to provide a supply voltage VCC, a reference terminal 3 to provide a basic voltage GND (in practice the terminal 3 is grounded), a charge pump 4 to produce a voltage VB, called an internal voltage, from the supply voltage VCC, and a detection circuit 13 that receives the internal voltage VB at an input 12 and produces a binary signal ON at an output 14 whose logic state is a function of the value of an internal voltage VB.

In the example described, the charge pump 4 doubles the supply voltage VCC. This charge pump 4 has an oscillator 5 that provides a clock signal CK. This signal is applied to a terminal of a capacitor 7. The other terminal of this capacitor 7 is connected, firstly, to the supply terminal 2 by means of a diode 8 and, secondly, to an output 10 by means of a diode 9. This output terminal 10 is connected to the first pole of an output capacitor 11. The output capacitor 11 has its other pole connected to the reference terminal 3.

It shall be assumed here that the output capacitor 11 is the equivalent of a capacitive circuit supplied by the charge pump 4. This explains the fact that this pump has only one capacitor 7. The internal voltage VB is the voltage present at the output 10 of the charge pump 4.

To stop the charge pump 4, it is assumed that the oscillator 5 has an input 6 to receive the logic signal ON in such a way that the oscillator 5 works if ON is in the logic state 1 and stops if it is in the logic state 0. If ON=0, the clock signal CK will be constant and at the potential of the ground and will therefore not charge the capacitor 7.

The output 10 is connected to the input 12 of the detection circuit 13.

Figure 3:
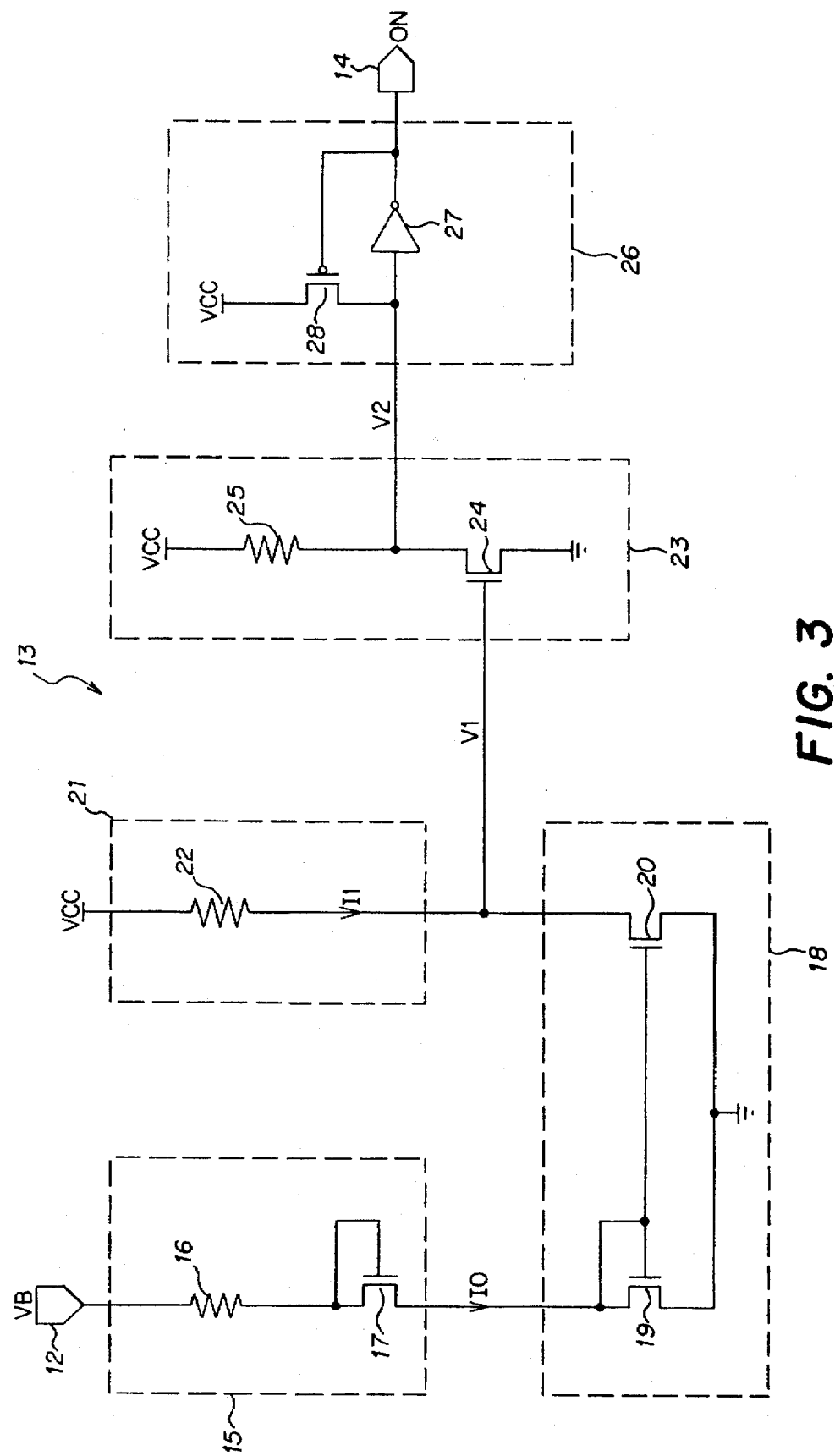
FIG. 3 shows the detection circuit of the circuit of FIG. 2.

The detection circuit 13 shown in FIG. 3 comprises:

a first resistive arm 15, this arm 15 receiving the internal voltage VB to produce a so-called basic current I0, a current mirror 18 connected to the first resistive arm 15 to produce a current I1, called a reference current, proportional to the basic current I0, a second resistive arm 21, connected to the current mirror 18, to produce a voltage V1 called a reference voltage representing the reference current I1, a voltage source 23 receiving the reference voltage V1 and producing a voltage V2 called a control voltage, and a logic circuit 26 receiving the control voltage V2 and producing the binary signal ON.

The first resistive arm 15 has a resistor 16, and a diode. The resistor 16 has a first pole connected to the input 12 of the circuit 13. Its value in ohms will be referenced R0. Its second pole is connected to the drain of an NMOS type field-effect transistor 17 mounted as a diode (its drain is connected to its control gate).

The current mirror 18 is formed by a first transistor and a second transistor, 19 and 20, called amplification transistors. The amplification transistors 19 and 20 are NMOS type field-effect transistors, namely of the same type as the type of the transistor 17. The drain of the first amplification transistor 19 is connected to its control gate, to the control gate of the second amplification transistor 20 and to the source of the transistor 17. The sources of the first and second amplification transistors 19 and 20 are connected to the ground.

The second resistive arm 21 has a resistor 22. The resistor 22 has a first pole connected to the supply terminal 2. Its value in ohms will be referenced R1. Its second pole is connected to the drain of the second amplification transistor 20.

We have:

I0=(VB−2 * $V_{tn}$)/R0, with $V_{tn}$ as the threshold voltage of an NMOS type transistor, I1=m * I0, with m as the gain of the current mirror, and V1=VCC−m * I0 * R1, with V1 as the voltage at the drain of the amplification transistor 20.

The voltage source 23 has an NMOS type field-effect transistor 24 and a resistor 25. The transistor 24 of the voltage source 23 is therefore of the same type as the amplification transistors 19 and 20 of the current mirror 18 and the transistor 17 mounted as a diode. The control gate of the transistor 24 is connected to the drain of the second amplification transistor 20. It receives the reference voltage V1. The source of the transistor 24 is connected to the ground. Its drain is connected to the supply terminal 2 by means of the resistor 25. The channel of the transistor 24 is therefore series-connected with the resistor 25.

The value in ohms of the resistor 25 shall be referenced R2 and the current flowing through the resistor 25 shall be referenced I2. V2 is the potential present at the drain of the transistor 24.

We have:

$$V2=VCC-R2 * I2,$$

I2=K * (V1−$V_{tn}$)2, with K as the factor of transconductance of the transistor 24.

By combining the above equations, we get:

$$V2 =VCC-R2 * K * [VCC-(VB-2 * V_m) * m * R1/R0-V_m]2.$$

In the example described, the logic circuit 26 comprises a standard CMOS type inverter 27 and a PMOS type field-effect transistor 28. The source of this transistor 28 is connected to the supply terminal 2. Its drain is connected to the input of the inverter 27. The control gate is connected to the output of this same inverter 27. The output of the inverter 27 is connected to the output 14 of the detection circuit 13. It is this inverter that produces the binary signal ON. The presence of the transistor 28 is not strictly indispensable. It makes it possible to ensure that the binary signal ON will have stable behavior, namely it will be non-floating.

Let us now determine the value of internal voltage VBM such that the signal ON goes from one logic state to the other. The change-over of the state of the signal ON occurs typically for V2=VCC/2.

The following is deduced therefrom:

$$VBM=[VCC-(VCC/2 * R2 * K))^{1/2}] * R0/(m * R1)+[2-R0/(m * R1)] * V_m.$$

For VB<VBM, we will have ON=1.
For VB>VBM, we will have ON=0.

It has been assumed that a current I0 flows through the first resistive arm 15, i.e. that VBM>2 * $V_{tn}$. If it is desired to produce a voltage VB lower than 2 * $V_{tn}$, it would be possible to do away with the transistor 17 placed solely in order to delay the appearance of the basic current I0 in the first resistive arm 15. For it is especially important to minimize the current I0 tapped at output of the charge pump 4 by the detection circuit 13, for the principle of operation of a charge pump such as this is based on the transfer of charge between capacitors. The primary aim of the presence of the charge pump is not normally that of supplying the detection circuit 13. It is also possible to minimize the value of the basic current I0 by choosing a high value of resistance in the first resistive arm 15. A problem of excessive space requirement is then encountered. The presence of one or more diodes enables this space requirement to be reduced to the minimum, at a basic current value that is identical for a given value of internal voltage. Thus, no substantial current will be taken at the output capacitor 11 and the build-up time of the internal voltage VB will not increase significantly (as compared with the build-up time in the case where only the output capacitor 11 is connected to the output 10 of the charge pump (4).

Furthermore, it is necessary to prevent a slow variation of the control voltage V2 around the change-over voltage of the inverter 27. Thus, preferably a substantial gain m and/or substantial values of resistance will be chosen in the second resistive arm 21 and the voltage source 23 to produce a control voltage V2 that varies greatly as a function of the basic current I0.

A description shall now be given of the behavior of the detection circuit 13 as a function of the variations that could affect it, first of all owing to the geometrical tolerances of manufacture and then owing to the environment of use.

Technological Variations

The components chiefly affected by this type of variation are the transistors.

For a MOS transistor, we have K=($\mu_n$ * $C_{ox}$ * W/L)/2, with μn as the mobility of the electrons, $C_{ox}$ as the capacity of the oxide and W/L as the geometrical ratio of the gate of the transistor.

As an initial approximation, it is possible to consider the variations in knowledge of the values of the resistors as being negligible. The greater the size of these resistors, more accurate the approximation will be.

Let it be assumed that the oxide thickness is smaller than the typical thickness. As compared with the expected values, K will be greater and $V_{tn}$ will be smaller.

[VCC−(VCC/(2 * R2 * K)$^{1/2}$] * R0/(m * R1) will be greater than what is expected and [2−R0/(m * R1)] * $V_{tn}$ will be smaller than what is expected.

On the whole, the diminishing of $V_{tn}$ could be compensated for by the increase of K, as a function of VCC, and by choosing appropriate values R0/R1, m and R2.

Symmetrically, the increase of $V_{tn}$ could be compensated for by the decrease of K if the value of the oxide thickness is greater than the typical thickness.

It will be useful, for reasons of simplification, to choose preferably transistors of one and the same type (NMOS transistors in the example being dealt with) to make the diode of the first resistive arm 15, the current mirror 18 and the voltage source 23. As regards the diode, the choice of an NMOS type transistor also has the consequence of increasing the value of VB from which a current I0 appears in the resistive arm 15 and hence of reducing the total consumption of the circuit 1.

Figure 1:
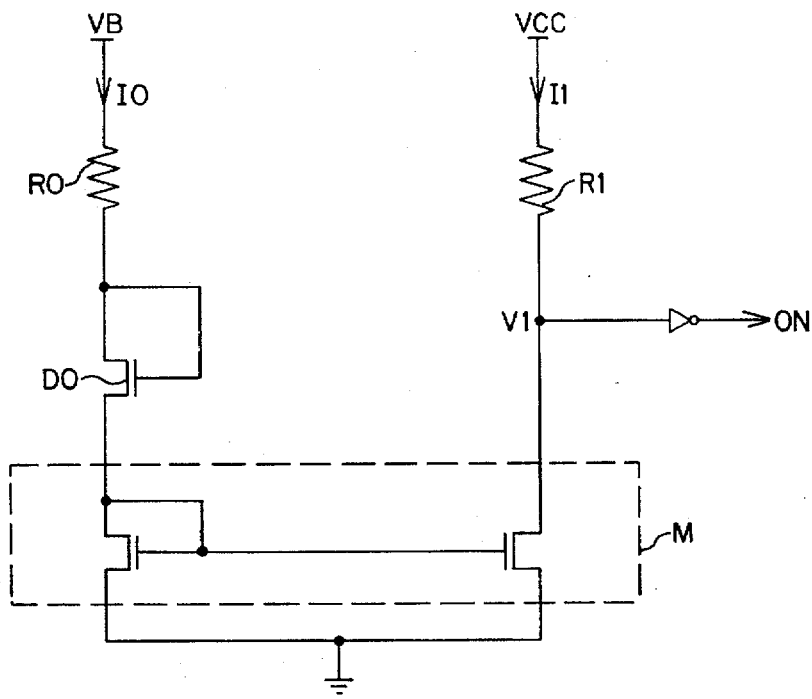
FIG. 1 shows a prior art detection circuit.

As compared with the prior art circuit (FIG. 1), the presence of the voltage source 23 makes it possible to compensate for the variations in threshold voltage of the transistors 17, 19 and 20.

As regards the inverter 27 of the logic circuit 26, the technological variations affect both the transistors that form it.

Let $V_{it}$ be the change-over voltage of this inverter.

We have $V_{it}=[[(K_p/K_n)^{1/2} * (VCC-V_{tp})]+V_{tn}] * (1+(K_p/K_n)^{1/2})^{-1}$, with $K_p$ and $K_n$ as the factors of transconductance of the PMOS and NMOS transistors, and $V_{tp}$ as the threshold voltage of a PMOS transistor.

In the computation of VBM, it has been assumed that $V_{tp}=-V_{tn}$ and $K_p=K_n$. Taking account of the presence of the inverter 27 in the sizing of the voltage source 23, it is possible to obtain a value of change-over voltage $V_{it}$ that is stable in technology.

Temperature Variations

All the components of the detection circuit 13 are affected by this type of variation.

Let us assume that the temperature increases. The threshold voltage $V_{tn}$ will tend to diminish, the factor K will tend to diminish and the values of resistance of the resistors will tend to increase (except for the nickel-chrome metal resistors, if any).

By choosing the resistor 25 in such a way that its temperature coefficient k2 is positive and the resistor 16 in such a way that its temperature coefficient k0 is more positive than the temperature coefficient k1 of the resistor 22, it is possible:

to compensate for the diminishing of K by the increasing of R2 if the product K * R2 has a value that is relatively independent of the temperature, and to compensate for the diminishing of [2-R0/(m * R1)] * $V_{tn}$ by the increasing of [VCC-(VCC/(2 * R2 * K))$^{1/2}$] * R0/(m * R1).

For example, the resistors 16, 22, 25 are diffused resistors such that:

the resistor 16 is an N type resistor, and the resistor 22 is an N+ type resistor, namely one made by the diffusion of a dopant with a doping level higher than that of the dopant used to make the resistor 16.

The resistors 16, 22 and 25 can be formed by several series-connected resistors of different types. Thus, for example, they can be formed by series-connected diffused resistors having doping characteristics, types of dopant and/or doping levels that are different. They could also be formed by series-connected resistors with different types of structure (diffused, pinch-off or metallic structures). By thus making the resistors 16, 22 and 25, values of temperature coefficients are obtained that are suited to the values of voltage produced and to the technological parameters of manufacture of the transistors, which determine the temperature variations of K and $V_{tn}$.

In the description, the terms resistor 16, resistor 22 and resistor 25 should not be understood in a restricted sense. These resistors 16, 22 and 25 could be:

physically manufactured resistors, resistors equivalent to several series-connected physically manufactured resistors, or more generally, resistive circuits characterized by a given temperature coefficient and a given value in ohms.

It is necessary solely to see to it that:

the temperature coefficient of the resistor 25 of the voltage source 23 is positive, and the temperature coefficient of the first resistive arm 15, namely that of the resistor 16, is more positive than the temperature coefficient of the second resistive arm 21, i.e. that of the resistor 22.

It is thus possible to compensate for the temperature variation of VBM.

It will be noted that, independently of the other parts of the detector, the voltage source 23 compensates for the temperature variation of V2. Indeed, K and R2 vary in opposite directions as a function of temperature.

As regard the inverter 27, a downward shift of the changeover voltage $V_{it}$ is observed. In the choice of the temperature coefficients, the resistance values of the resistive arms will be taken into account.

It will be noted that the above detailed description has been made with reference to an advantageous application of the invention in an electrically programmable memory type of integrated circuit. This is of course only a particular, non-restrictive example. The charge pump could very well be external to the integrated circuit. Nor will the binary signal produced by the detection circuit be used obligatorily to control a supply circuit. It could be used more generally to provide an information element on the value of a voltage. The detection circuit as described could also very well be made by means of discrete components without departing from the context of the invention. Similarly, this circuit could very well be made by means of a technology different from MOS technology.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A voltage detection circuit which provides a binary signal having a state that represents a value of an internal voltage, the voltage detection circuit comprising:

a first resistive arm which receives the internal voltage and produces a basic current, current amplification means which produces a reference current proportional to the basic current, a second resistive arm which produces a reference voltage representing the reference current, a voltage source which produces a control voltage from the reference voltage, and a logic circuit which produces the binary signal from the control voltage.

2. The circuit according to claim 1, wherein a temperature coefficient of the first resistive arm is more positive than a temperature coefficient of the second resistive arm.

3. The circuit according to claim 1, wherein one or both of the first resistive arm the second resistive arm comprise series-connected resistors of different types.

4. The circuit according to claim 1, wherein the voltage source comprises at least one resistor comprising a positive temperature coefficient.

5. The circuit according to claim 4, wherein the voltage source comprises a field-effect transistor having a channel series-connected with the resistor and receiving the reference voltage at a control gate.

6. The circuit according to claim 4, wherein the resistor of the voltage source is formed by series-connected resistors of different types.

7. The circuit according to claim 5, wherein a value of the product of the temperature coefficient of the resistor of the voltage source and of a factor of transconductance of the transistor of this voltage source is relatively independent of the temperature.

8. The circuit according to claim 5, wherein the current amplification means comprise a current mirror formed by amplification transistors of a same type as the transistor of the voltage source.

9. The circuit according to claim 5, wherein the first resistive arm comprises at least one shift diode formed by means of a transistor of a same type as that of the transistor of the voltage source.

10. A voltage detection circuit comprising:

a first resistive arm having an input which receives a first voltage and which outputs a first current;

a current amplifier which amplifies said first current to produce a reference current;

a second resistive arm which receives said reference current as an input, and outputs a corresponding reference voltage;

a voltage source which produces a control voltage from said reference voltage; and a logic circuit which converts said control voltage to a binary signal which represents a value of said first voltage.

11. The voltage detection circuit of claim 10, wherein said first resistive arm comprises at least one shift diode.

12. The voltage detection circuit of claim 10, wherein a temperature coefficient of the first resistive arm is more positive than a temperature coefficient of the second resistive arm.

13. The voltage detection circuit of claim 10, wherein said current amplifier comprises a current mirror having an input for receiving said first current and an output for outputting said reference current.

14. The voltage detection circuit of claim 13, wherein said current mirror comprises a first transistor having a first terminal coupled to said input of said current mirror, a second terminal coupled to said input of said current mirror and a third terminal coupled to ground, and a second transistor having a first terminal coupled to said output of said current mirror, a second terminal coupled to said input of said current mirror and a third terminal coupled to ground.

15. The voltage detection circuit of claim 10, wherein said voltage source comprises at least one resistor having a positive temperature coefficient.

16. The voltage detection circuit of claim 15, wherein said voltage source comprises a transistor having a first terminal coupled to a terminal of said resistor and a second terminal coupled to receive the reference voltage.

17. The voltage detection circuit of claim 16, wherein a value of the product of the temperature coefficient of said resistor and a factor of transconductance of said transistor is relatively independent of temperature.

18. A voltage detecting method comprising the steps of:

(a) converting an internal voltage to a first current;

(b) amplifying said first current to product a reference current;

(c) producing a reference voltage from said reference current;

(d) converting said reference voltage to a control voltage; and (e) outputting a signal which represents a voltage level of said internal voltage.

19. The method of claim 18, wherein step (b) comprises using a current mirror to amplify said first current.

20. The method of claim 18, wherein step (d) comprises using a voltage source to convert said reference voltage to said control voltage.

* * * * *

UNITED STATES PATENT AND TRADEMARK OFFICE
CERTIFICATE OF CORRECTION

PATENT NO. : 5,708,420  
APPLICATION NO. : 08/589220  
DATED : January 13, 1998  
INVENTOR(S) : Sylvie Drouot Page 1 of 1

It is certified that error appears in the above-identified patent and that said Letters Patent is hereby corrected as shown below:

Claim 18, col. 10, line 20 should read:
(b) amplifying said first current to produce a reference Signed and Sealed this Third Day of June, 2008

JON W. DUDAS  
*Director of the United States Patent and Trademark Office*